United States Patent
Zhang et al.

(10) Patent No.: US 8,497,552 B2
(45) Date of Patent: Jul. 30, 2013

(54) SEMICONDUCTOR DEVICES WITH CURRENT SHIFTING REGIONS AND RELATED METHODS

(75) Inventors: Qingchun Zhang, Cary, NC (US); Anant K. Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 831 days.

(21) Appl. No.: 12/512,281

(22) Filed: Jul. 30, 2009

(65) Prior Publication Data

US 2010/0133549 A1 Jun. 3, 2010

Related U.S. Application Data

(60) Provisional application No. 61/118,825, filed on Dec. 1, 2008.

(51) Int. Cl.
*H01L 29/66* (2006.01)

(52) U.S. Cl.
USPC ........... 257/341; 257/496; 257/586; 257/196; 257/618; 438/39; 438/343

(58) Field of Classification Search
USPC .................. 438/FOR. 123, 571, 586, 39, 40, 438/41, 47, 46, 343, 197, 198, 164, FOR. 149, 438/FOR. 424, 312, 52, 133, 186, 188, 235, 438/332; 257/E29.185, 466, 496, 571, 573, 257/586, 77, 339, 341, 492, 495, 623, 624, 257/625, 618, 171, 452, 471, 472, 473, 474, 257/170, 169, 600, 627, 628, 567, 584, 79, 257/80, 81, 83, 84, 85, 86, 91, 94, 96, 97, 257/99, 101, 103, 491, 183, 184, 187, 12, 257/196, 197, 288, 289, 290, 291, 292, 591
See application file for complete search history.

(56) References Cited

U.S. PATENT DOCUMENTS

| | | | |
|---|---|---|---|
| 4,806,997 A | * | 2/1989 | Simmons et al. ............. 327/512 |
| 4,927,772 A | | 5/1990 | Aruthur et al. |

(Continued)

FOREIGN PATENT DOCUMENTS

| | | |
|---|---|---|
| EP | 1 806 787 A1 | 7/2007 |
| JP | 3-225870 | 10/1991 |

(Continued)

OTHER PUBLICATIONS

International Search Report and Written Opinion corresponding to International Application No. PCT/US2008/010538; Mailing Date: Dec. 22, 2008, 13 pages.

Katsunori Ueno et al. "The Guard-Ring Termination for the High Voltage SiC Schottky Barrier Diodes" *IEEE Electron Device Letters* 16(7):1-2, 1995.

(Continued)

*Primary Examiner* — Ha Nguyen
*Assistant Examiner* — Thanh Y Tran
(74) *Attorney, Agent, or Firm* — Myers Bigel Sibley & Sajovec, P.A.

(57) ABSTRACT

A semiconductor device may include a semiconductor buffer layer having a first conductivity type and a semiconductor mesa having the first conductivity type on a surface of the buffer layer. In addition, a current shifting region having a second conductivity type may be provided adjacent a corner between the semiconductor mesa and the semiconductor buffer layer, and the first and second conductivity types may be different conductivity types. Related methods are also discussed.

34 Claims, 6 Drawing Sheets

U.S. PATENT DOCUMENTS

| | | | |
|---|---|---|---|
| 5,273,933 A * | 12/1993 | Hatano et al. | 117/89 |
| 5,914,500 A | 6/1999 | Bakowski et al. | |
| 6,627,552 B1 * | 9/2003 | Nishio et al. | 438/694 |
| 6,696,705 B1 | 2/2004 | Barthelmess et al. | |
| 6,703,642 B1 | 3/2004 | Shah | |
| 7,279,115 B1 | 10/2007 | Sumakeris | |
| 2007/0120148 A1 | 5/2007 | Nogome | |
| 2007/0241427 A1 | 10/2007 | Mochizuki et al. | |
| 2009/0078955 A1 * | 3/2009 | Fan et al. | 257/98 |
| 2009/0121319 A1 | 5/2009 | Zhang et al. | |
| 2010/0032685 A1 * | 2/2010 | Zhang et al. | 257/77 |

FOREIGN PATENT DOCUMENTS

| | | |
|---|---|---|
| JP | H09-501270 | 2/1997 |
| JP | 11-274482 | 10/1999 |
| JP | 2001-035857 A | 2/2001 |
| JP | 2003-243648 A | 8/2003 |
| JP | 2005-167035 A | 6/2005 |
| WO | WO 95/05006 A1 | 2/1995 |
| WO | WO 96/03774 | 2/1996 |
| WO | WO 97/08754 | 3/1997 |
| WO | WO 2005/093796 A1 | 10/2005 |
| WO | WO 2006/135031 | 12/2006 |
| WO | WO 2006/135031 A2 | 12/2006 |
| WO | WO 2006/135031 A3 | 12/2006 |
| WO | WO 2007/040710 A1 | 4/2007 |

OTHER PUBLICATIONS

Myer-Ward et al. "Turning of Basal Plane Dislocations During Epitaxial Growth on 4 off-axis 4h-SiC" *7th European Conference on Silicon Carbide and Related Materials*, Barcelona-Spain, Sep. 7-11, 2008 retrieved from http://www.ecscrm08.com/invited_presentations.html, retrieved Jul. 1, 2009.

Singh et al. "Planar Terminations in 4H-SiC Schottky Diodes with Low Leakage and High Yields" *IEEE International Symposium on Power Semiconductor Devices and ICs* pp. 157-160, 1997.

International Preliminary Report on Patentability corresponding to International Application No. PCT/US2009/065251; Date of Mailing: Mar. 8, 2011; 16 pages.

International Search Report and Written Opinion (14 pages) corresponding to International Application No. PCT/US2009/065251; Mailing Date: Jun. 1, 2010.

Japanese Office Action Corresponding to Japanese Patent Application No. 2011-538639; Mailing Date: Nov. 20, 2012; English Translation, 5 Pages.

Hiroyuki Matsunami, "Semiconductor SiC Technology and Application", Japan, Nikkan Kogyo Shimbun Ltd., *Business & Technology Daily News*, Mar. 31, 2003, pp. 35-37, 58.

Japanese Office Action Corresponding to Japanese Patent Application No. 2009-272182; Mailing Date: Nov. 20, 2012; 4 Pages, English Translation.

* cited by examiner

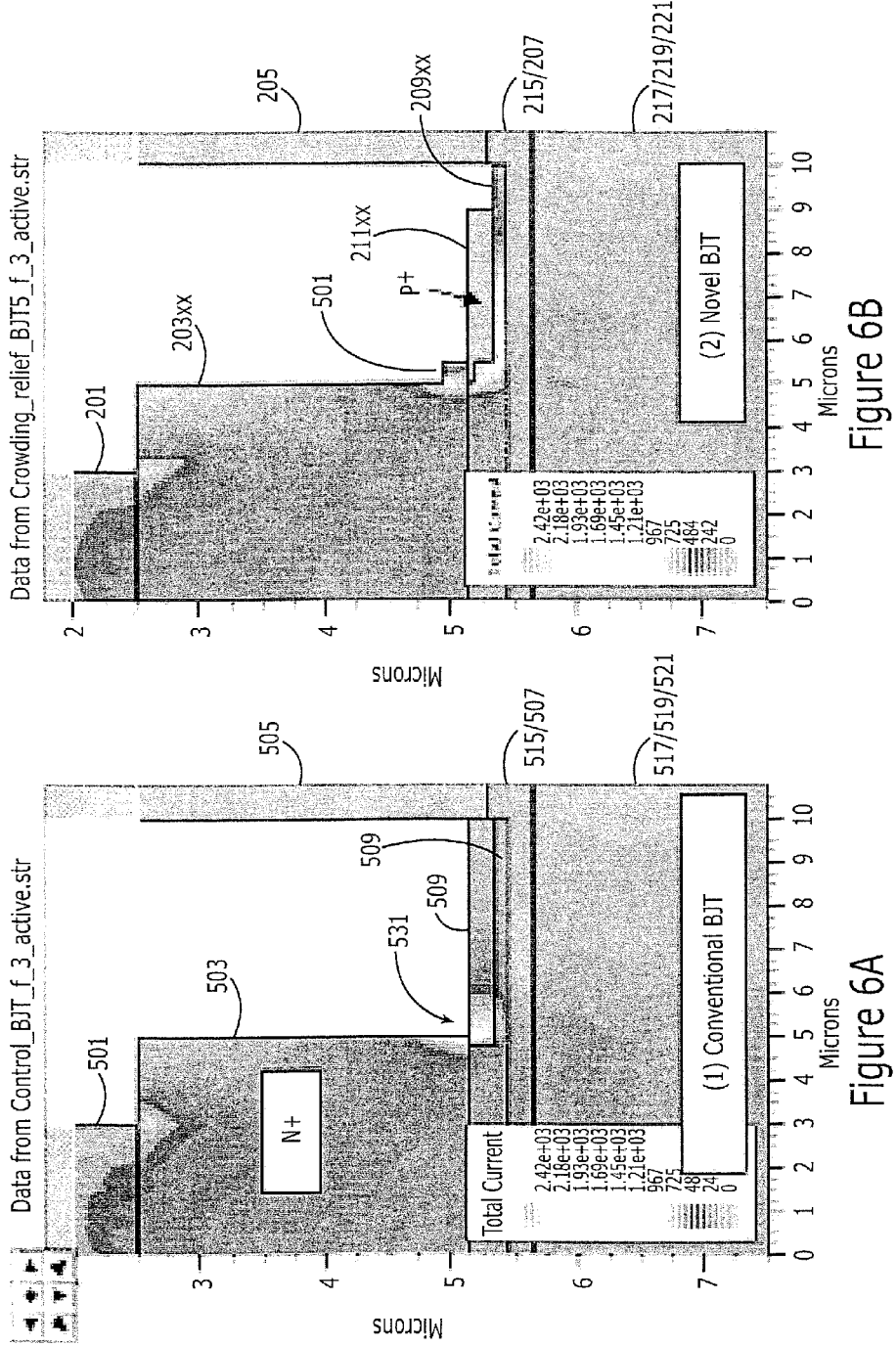

__US 8,497,552 B2__

SEMICONDUCTOR DEVICES WITH CURRENT SHIFTING REGIONS AND RELATED METHODS

RELATED APPLICATION

The present application claims the benefit of priority from U.S. Provisional Application No. 61/118,825 filed Dec. 1, 2008, and entitled "Stable Power Devices On Low-Angle Off-Cut Silicon Carbide Crystals," the disclosure of which is hereby incorporated herein in its entirety by reference.

STATEMENT OF GOVERNMENT INTEREST

This invention was made with Government support under contract no. W911NF-04-2-0022 awarded by the U.S. Army Research Laboratory. The Government has certain rights in the invention.

BACKGROUND

The present invention relates to electronic devices, and more particularly to electronic devices including semiconductor mesa structures and related methods.

High voltage silicon carbide (SiC) devices can handle voltages above about 600V or more. Such devices may handle as much as about 100 amps or more of current, depending on their active area. High voltage SiC devices have a number of important applications, particularly in the field of power conditioning, distribution and control. High voltage semiconductor devices, such as Schottky diodes, MOSFETs (metal-oxide-semiconductor field effect transistors), GTOs (gate turn-off thyristors), IGBTs (insulated gate bipolar transistors), BJTs (bipolar junction transistors), etc., have been fabricated using silicon carbide.

A conventional SiC power device, such as a SiC Schottky diode structure, has an n-type SiC substrate on which an n− epitaxial layer, which functions as a drift region, is formed. The device typically includes a Schottky contact formed directly on the n− layer. Surrounding the Schottky contact is a p-type JTE (junction termination extension) region that is typically formed by ion implantation. The implants may be aluminum, boron, or any other suitable p-type dopant. The purpose of the JTE region is to reduce electric field crowding at the edges of the junction, and to reduce or prevent the depletion region from interacting with the surface of the device. Surface effects may cause the depletion region to spread unevenly, which may adversely affect the breakdown voltage of the device. Other termination techniques include guard rings and floating field rings that may be more strongly influenced by surface effects. A channel stop region may also be formed by implantation of n-type dopants, such as nitrogen or phosphorus, in order to reduce extension of the depletion region toward the edge of the device.

In addition to junction termination extension (JTE), multiple floating guard rings (MFGR) and field plates (FP) are commonly used termination schemes in high voltage silicon carbide devices. Another conventional edge termination technique is a mesa edge termination. However, the presence of a mesa termination may cause a high electric field to occur at the mesa corner, even if a junction termination extension or guard ring is present. Over-etching of the mesa can exacerbate the problem of electric field crowding at the mesa corner. A high electric field at the mesa corner may result in a much lower breakdown voltage than would otherwise be expected for a given drift layer thickness and doping.

A conventional mesa-terminated PIN diode is illustrated in FIG. 1. As shown therein, a PIN diode 10 includes an n− drift layer 12 between a p+ layer 16 and an n+ substrate 14. FIG. 1 illustrates one half of a PIN-structure; the structure may include mirror image portions (not shown). An anode contact 23 is on the p+ layer 16, and a cathode contact 25 is on the n+ substrate 14. The p+ layer 16 is formed as a mesa on the n− drift layer 12. A junction termination extension (JTE) region 20 including a plurality of JTE zones 20A, 20B, 20C is provided in the n− drift layer 12 adjacent the p+ mesa 16. The JTE zones 20A, 20B, 20C are p-type regions that may have levels of charge that decrease outwardly with distance from the PN junction between the p+ mesa 16 and the n− drift layer 12. Although three JTE zones 20A, 20B, 20C are illustrated, more or fewer JTE zones may be provided.

As shown in FIG. 1, the n− drift layer 12 adjacent the p+ mesa 16 may be slightly over-etched due, for example, to difficulties in etch process control, so that a sidewall 12A of the n-drift layer 12 beneath the p+ mesa 16 may be exposed. Over-etching of up to about 3000 Å (Angstroms) may occur in some cases. To protect the exposed sidewall 12A, a sidewall implant may be performed in which p-type impurities are implanted into the sidewall 12A to form a sidewall implant region 22.

In conventional mesa-terminated structures, such as the PIN diode structure 10 illustrated in FIG. 1, field crowding may occur at or near the mesa corners 29, resulting in high electric field strengths at the corners 29. These high field strengths can reduce the breakdown voltage of the device. For example, a conventional mesa-terminated PIN diode structure that has a theoretical breakdown voltage of 12 kV, based on thickness and doping of the drift layer and the JTE design, may have an effective breakdown voltage of only 8 kV.

In addition to field crowding, another challenge in the development of SiC power bipolar junction transistors (BJTs) is the phenomenon of current gain degradation, that is, a reduction in current gain over time in the device. Current gain degradation is typically attributed to material defects such as basal plane dislocations (BPDs) and to surface recombination, especially along the emitter sidewall and surface of the base of the device. A slight reduction of current gain degradation on SiC BJTs fabricated on BPD-free wafers has been observed. In addition, the emitter fingers of SiC BJTs are typically formed by reactive ion etching (RIE). The non-uniformity of RIE etching rate can partially or completely etch away the base material around the wafer periphery, which can cause a large reduction in yields.

SUMMARY

According to some embodiments of the present invention, a bipolar semiconductor device may include a semiconductor buffer layer having a first conductivity type and a semiconductor mesa having the first conductivity type on a surface of the buffer layer. A current shifting region having a second conductivity type may be provided adjacent a corner between the semiconductor mesa and the semiconductor buffer layer. Moreover, the first and second conductivity types may be different conductivity types, and the current shifting region may be between portions of the semiconductor buffer layer and the semiconductor mesa having the first conductivity type.

In addition, a metal electrode may be provided on a surface of the semiconductor mesa so that the semiconductor mesa is between the metal electrode and the semiconductor buffer layer. Central portions of the semiconductor mesa adjacent the semiconductor buffer layer may be free of the current shifting region to provide an electrical current path of the first conductivity type from the metal electrode to a surface of the semiconductor buffer layer opposite the semiconductor mesa and/or to provide an electrical current path of the first conductivity type from the surface of the semiconductor buffer layer opposite the semiconductor mesa to the metal electrode. The current shifting region may extend to portions of the semiconductor buffer layer that are free of the semiconductor mesa.

A semiconductor step may be provided adjacent the semiconductor mesa and a thickness of the semiconductor step may be less than a thickness of the semiconductor mesa. Moreover, a depth of the current shifting region into the buffer layer adjacent the semiconductor step may be less than a depth of the current shifting region into a portion of the buffer layer that is free of the semiconductor step.

A semiconductor control layer having the second conductivity type may be provided on the semiconductor buffer layer so that the semiconductor buffer layer is between the semiconductor control layer and the semiconductor mesa and so that semiconductor buffer layer is between the current shifting region and the semiconductor control layer. In addition, a control contact region having the second conductivity type may extend through the semiconductor buffer layer to provide electrical coupling with the semiconductor control layer, and the control contact region may be spaced apart from the current shifting region.

A semiconductor drift layer having the first conductivity type may be provided so that the semiconductor control layer is between the semiconductor drift layer and the semiconductor buffer layer. A first metal electrode may be provided on the semiconductor mesa so that the semiconductor mesa is between the first metal electrode and the semiconductor buffer layer. A second metal electrode may be provided on the control contact region so that the control contact region is between the second metal electrode and the semiconductor control layer. A third metal electrode may be provided so that the semiconductor drift layer is between the third metal electrode and the semiconductor control layer.

A semiconductor anode/cathode layer having the second conductivity type may be provided between the semiconductor drift layer and the third metal electrode.

The semiconductor control, drift, and/or anode/cathode layers may be provided on a silicon carbide substrate so that the semiconductor control, drift, and/or anode/cathode layers is/are between the silicon carbide substrate and the semiconductor buffer layer. In addition, the silicon carbide substrate may define a surface that is cut off axis at an angle of no more than about 4 degrees or that is cut on axis. Moreover, crystalline structures of the semiconductor control layer, the semiconductor buffer layer, and the semiconductor mesa may be aligned with respect to a crystalline structure of the silicon carbide substrate.

According to other embodiments of the present invention, a method of forming a bipolar semiconductor device may include forming a semiconductor buffer layer having a first conductivity type, and forming a semiconductor mesa having the first conductivity type on a surface of the buffer layer. A current shifting region having a second conductivity type may be formed adjacent a corner between the semiconductor mesa and the semiconductor buffer layer. Moreover, the first and second conductivity types may be different conductivity types, and the current shifting region may be between portions of the semiconductor buffer layer and the semiconductor mesa having the first conductivity type.

Forming the current shifting region may include doping (e.g., implanting) an exposed portion of the semiconductor buffer layer adjacent the semiconductor mesa with a dopant having the second conductivity type after forming the semiconductor mesa. The semiconductor buffer layer and the semiconductor mesa may be thermally treated so that portions of the dopant diffuse between the semiconductor mesa and the semiconductor buffer layer.

Forming the semiconductor mesa may include epitaxially forming a semiconductor mesa layer on an entirety of the semiconductor buffer layer. Portions of the semiconductor mesa layer may be selectively removed (e.g., using reactive ion etching or RIE) to define the semiconductor mesa and to expose portions of the semiconductor buffer layer.

A metal electrode may be formed on a surface of the semiconductor mesa so that the semiconductor mesa is between the metal electrode and the semiconductor buffer layer. Central portions of the semiconductor mesa adjacent the semiconductor buffer layer may be free of the current shifting region to provide an electrical current path of the first conductivity type from the metal electrode to a surface of the semiconductor buffer layer opposite the semiconductor mesa and/or to provide an electrical current path of the first conductivity type from the surface of the semiconductor buffer layer opposite the semiconductor mesa to the metal electrode.

The current shifting region may extend to portions of the semiconductor buffer layer that are free of the semiconductor mesa.

Before forming the current shifting region, a semiconductor step may be formed adjacent the semiconductor mesa wherein a thickness of the semiconductor step is less than a thickness of the semiconductor mesa. A depth of the current shifting region into the buffer layer adjacent the semiconductor step may be less than a depth of the current shifting region into a portion of the buffer layer that is free of the semiconductor step. Forming the semiconductor step may include selectively removing (e.g., using reactive ion etching or ME) portions of the semiconductor buffer layer spaced apart from the semiconductor mesa to define the semiconductor step adjacent the semiconductor mesa after forming the semiconductor mesa.

Forming the current shifting region may include doping (e.g., using ion implantation) portions of the semiconductor buffer layer adjacent the semiconductor step with a dopant having the second conductivity type after forming the semiconductor mesa and after forming the semiconductor step. The semiconductor buffer layer and the semiconductor mesa may be thermally treated so that portions of the dopant diffuse between the semiconductor mesa and the semiconductor buffer layer.

Before forming the semiconductor buffer layer, a semiconductor control layer having the second conductivity type may be formed, and forming the semiconductor buffer layer may include forming the semiconductor buffer layer on the semiconductor control layer. Accordingly, the semiconductor buffer layer may be between the semiconductor control layer and the semiconductor mesa so that the semiconductor buffer layer is between the current shifting region and the semiconductor control layer. After forming the semiconductor mesa, a control contact region having the second conductivity type may be formed, and the control contact region may extend through the semiconductor buffer layer to provide electrical coupling with the semiconductor control layer. The control contact region may be spaced apart from the current shifting region.

Before forming the semiconductor control layer, a semiconductor drift layer having the first conductivity type may be formed, and forming the semiconductor control layer may include forming the semiconductor control layer on the semiconductor drift layer. Accordingly, the semiconductor control layer may be between the semiconductor drift layer and the semiconductor buffer layer. A first metal electrode may be formed on the semiconductor mesa so that the semiconductor mesa is between the first metal electrode and the semiconductor buffer layer. A second metal electrode may be formed on the control contact region so that the control contact region is between the second metal electrode and the semiconductor control layer. A third metal electrode may be formed on the semiconductor drift layer so that the semiconductor drift layer is between the third metal electrode and the semiconductor control layer.

Before forming the semiconductor drift layer, a semiconductor anode/cathode layer may be formed, and forming the semiconductor drift layer may include forming the semiconductor drift layer on the semiconductor anode/cathode layer so that the semiconductor anode/cathode layer is between the semiconductor drift layer and the third metal electrode.

Forming the semiconductor control, drift, and/or anode/cathode layers may include forming the semiconductor control, drift, and/or anode/cathode layers on a silicon carbide substrate so that the semiconductor control, drift, and/or anode/cathode layers is/are between the silicon carbide substrate and the semiconductor buffer layer. The silicon carbide substrate may define a surface that is cut off axis at an angle of no more than about 4 degrees or that is cut on axis, and crystalline structures of the semiconductor control layer, the semiconductor buffer layer, and the semiconductor mesa may be aligned with respect to a crystalline structure of the silicon carbide substrate. Stated in other words, the semiconductor mesa, buffer, control, drift, and/or anode/cathode layers may be epitaxially formed on the silicon carbide substrate.

DESCRIPTION OF THE DRAWINGS

The accompanying drawings, which are included to provide a further understanding of the invention and are incorporated in and constitute a part of this application, illustrate certain embodiment(s) of the invention. In the drawings:

FIG. 6A is an illustration of simulated current concentrations in a conventional BJT structure.

FIG. 6B is an illustration of simulated current concentrations in a BJT including a stepped current shifting region according to some embodiments of the present invention.

DETAILED DESCRIPTION

Figure 1:
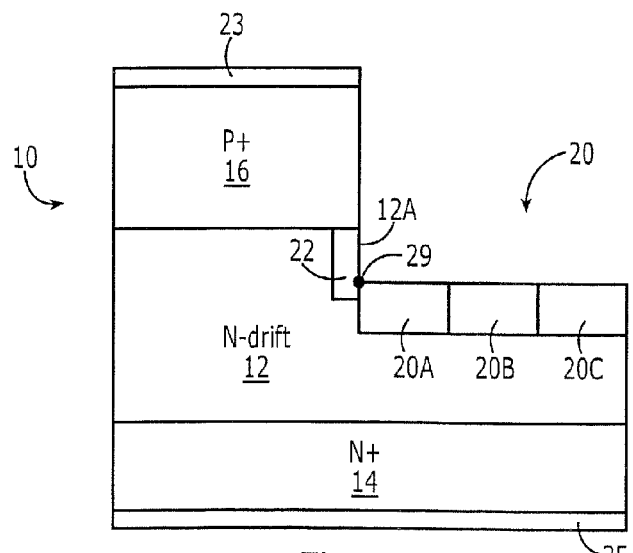
FIG. 1 is a cross-sectional view illustrating a conventional mesa terminated PIN diode structure.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Semiconductor power devices may include bipolar power devices such as merged PiN-Schottky diodes (MPSs), PiN diodes (PNs), Bipolar Junction Transistors (BJTs), insulated gate bipolar transistors (IGBTs), Gate Turn-Off Thyristors (GTOs), MOS-controlled thyristors (MCTs), etc., and unipolar power devices (which may incorporate conductivity modulation to achieve surge capability) such as Schottky diodes with a highly doped P+ region, and heterojunction diodes with other materials such as polysilicon. When fabricated on 8 degree off oriented silicon carbide (SiC), such semiconductor power devices may suffer from performance degradation such as increased forward voltage drop ($V_f$ drift), current gain reduction, reverse leakage current increase, etc.

Performance degradation in devices fabricated on 8 degree off oriented SiC may be due to extended growth of basal plane dislocation (BPDs) to stacking faults (SFs) within the active area when forward biasing the junction, via carrier recombination between electrons and holes. These recombinations may enhance the glide of the partial dislocations bounding the stacking fault in the basal planes. The presence of the SFs may locally reduce carrier lifetimes, create excess interface defects, etc. within the SiC crystal and any interface.

Improved thick epitaxial layer growth conditions have been developed to enable high-quality and low defect density (including low BPD density) growth on SiC substrates that are oriented 2 degrees to 6 degrees off axis from the (0001) basal plane. Epitaxial layers grown in this fashion have exhibited reduced BPD densities and therefore reduction in $V_f$ drift and improvement in other performance characteristics without using multi-step etching operations discussed, for example, in U.S. Pat. No. 7,279,115 entitled "Method To Reduce Stacking Fault Nucleation Sites And Reduce $V_f$ Drift In Bipolar Devices," the disclosure of which is hereby incorporated herein in its entirety by reference.

According to embodiments of the present invention, semiconductor power devices providing stable performance may be fabricated on SiC substrates having a low angle of cut off of the [0001] axis or having a surface cut parallel to the axis. SiC substrates with low angle cuts are discussed for example, in U.S. Provisional Application No. 61/118,825, filed Dec. 1, 2008, and entitled "Stable Power Devices On Low-Angle Off-Cut Silicon Carbide Crystals", the disclosure of which is hereby incorporated herein in its entirety by reference. In a SiC BJT, for example, current gain degradation may be attributed to generation of defects such as stacking faults (SFs) due to carrier recombination and/or surface recombination, especially in emitter mesa corners. According to embodiments of the present invention, surface recombination at emitter mesa corners may be reduced by shifting current crowding away from the mesa corner and toward the SiC bulk. By shifting current crowding away from the mesa corner, current gain degradation may be reduced.

Figure 2A:
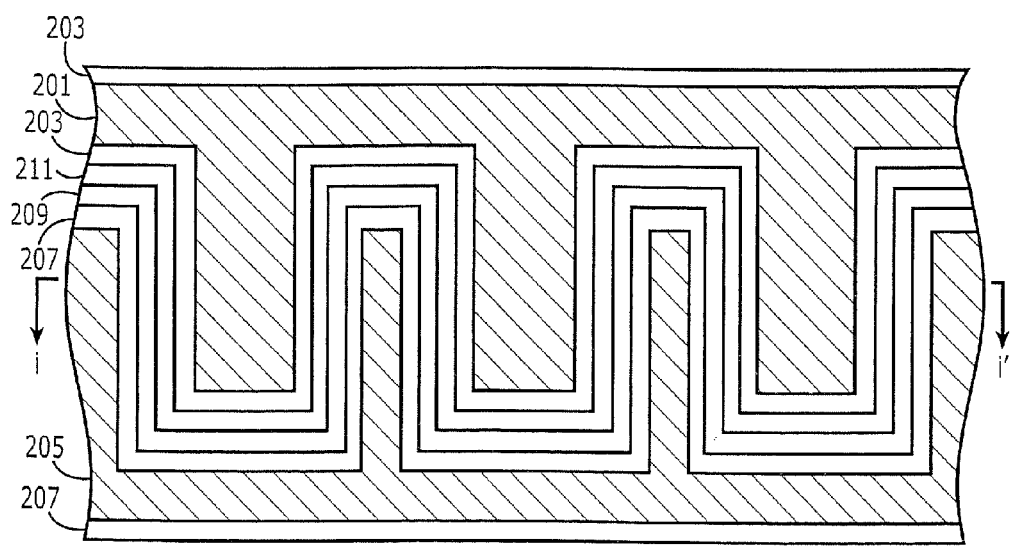
FIG. 2A is a plan view illustrating a semiconductor device including interdigitated electrodes according to some embodiments of the present invention.

FIG. 2A is a plan view of a portion illustrating a semiconductor device including interdigitated electrodes according to some embodiments of the present invention. In particular, a first interdigitated electrode 201 may be provided on a semiconductor mesa 203 having a first conductivity type, and a second interdigitated electrode 205 may be provided on a control contact region 207 having a second conductivity type different than the first conductivity type. In addition, semiconductor mesa 203 may be provided on a semiconductor buffer layer 209 having the first conductivity type, and a current shifting region 211 having the second conductivity type may be provided in semiconductor buffer layer 209 adjacent semiconductor mesa 203. While not shown in the plan view of FIG. 2A, current shifting region 211 may extend between a peripheral portion of semiconductor mesa 203 and semiconductor buffer layer 209. The semiconductor mesa, buffer, current shifting, and contact regions 203, 211, 211, and 207 may be provided in an active region of the semiconductor device, and a termination region of the semiconductor device (not shown) may surround the active region. Buffer layer 209 may provide a margin for over etch when forming mesas 203 so that an etch used to form mesas 203 does not inadvertently expose portions of an underlying semiconductor control layer having the second conductivity type (e.g., base layer 215' of FIG. 2B, or gate layer 215" of FIG. 2C).

The structure illustrated in the plan view of FIG. 2A may be used for different types of semiconductor power devices as discussed in greater detail below. For example, the structure of FIG. 2A may be used to implement bipolar junction transistors and/or gate turn off thyristors according to embodiments of the present invention.

Figure 2B:
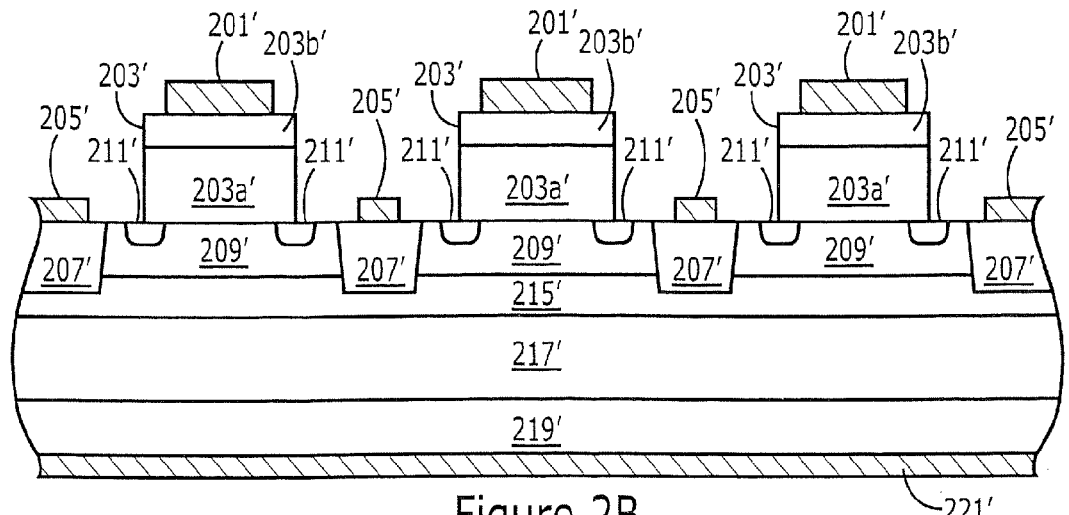
FIG. 2B is a cross sectional view taken along section line i-i' of FIG. 2A illustrating a structure of a bipolar junction transistor (BJT) according to some embodiments of the present invention.

FIG. 2B is a cross sectional view taken along section line i-i' of FIG. 2A illustrating a structure of a bipolar junction transistor (BJT) according to some embodiments of the present invention. In the BJT, first metal electrode 201' may be referred to as an emitter/collector electrode, second metal electrode 205' may be referred to as a base electrode, and control contact region 207' may be referred to as a base contact region. In addition to the elements discussed above with respect to FIG. 2A, the BJT of FIG. 2B may include a base layer 215' having the second conductivity type, a drift layer 217' having the first conductivity type, and a substrate 219' having the first conductivity type. The substrate 219' may serve as a collector/emitter, and a third metal electrode 221' may be referred to as a collector/emitter electrode. Accordingly, a current applied to electrode 205' (or base electrode)

may be used to control an electrical current between electrodes 201' and 221' (or between emitter and collector electrodes).

In addition, semiconductor mesa 203' may include regions 203a' and 203b' (both having the first conductivity type) with region 203b' having a higher concentration of majority carriers than region 203a'. Region 203b', for example, may have a high dopant concentration to provide ohmic contact with electrode 201'.

Accordingly, the BJT of FIG. 2B may provide switching/control of relatively high electrical currents between electrodes 201' and 221' responsive to an electrical signal applied to electrode 205'. The BJT of FIG. 2B may thus be referred to as a "vertical" power device because the switched/controlled current flows in a "vertical" direction between electrodes 201' and 221' on opposite sides of substrate 219' (with "vertical" being determined with respect to the orientation of the structure as illustrated in FIG. 2B). Because the "vertical" current may be distributed across the continuous electrode 221' but concentrated at fingers of interdigitated electrode 201', current crowding may occur at corners between semiconductor mesas 203' and buffer layer 209'. By providing current shifting region 211', this current crowding may be moved away from the corners between semiconductor mesas 203' and buffer layer 209'. More particularly, a p-n junction defined between buffer layer 209' (having the first conductivity type) and current shifting region 211' (having the second conductivity type) and/or a p-n junction defined between the semiconductor mesa 203' (having the first conductivity type) and the current shifting region 211' (having the second conductivity type) may reduce/prohibit the flow of electrical current through the current shifting region 211'.

Substrate 219' may be a silicon carbide substrate (SiC) having a surface that is cut off axis by an angle of no more than about 4 degrees or that is cut on axis to thereby reduce basal plane dislocations (BPDs). Substrate 219', for example, may be a 4H-polytype SiC substrate having a surface that corresponds generally to the c-face of the silicon carbide crystal that has been cut at an off axis angle α (alpha) towards the <11$\overline{2}$0> (<one, one, two-bar, zero>) direction where the off axis angle α (alpha) is no more than about 4 degrees. A surface that is cut off axis by an angle of no more than about 4 degrees may include a surface that is cut on axis (i.e., a surface that is cut off axis by an angle of 0 degrees). SiC substrates with low off-cut angles are discussed, for example, in U.S. Provisional Application No. 61/118,825, filed Dec. 1, 2008, and entitled "Stable Power Devices On Low-Angle Off-Cut Silicon Carbide Crystals", the disclosure of which is hereby incorporated herein in its entirety by reference. Each of the semiconductor layers/regions on substrate 219' (e.g., drift layer 217', base layer 215', buffer layer 209', mesa 203', base contact region 207', and current shifting region 211') may be SiC layers/regions formed using epitaxial deposition, implant/diffusion, and/or etching. Accordingly, each of the semiconductor layers/regions (e.g., drift layer 217', base layer 215', buffer layer 209', mesa 203', base contact region 207', and current shifting region 211') on substrate 219' may have a single crystal structure that is aligned with a crystal structure of substrate 219'.

According to some embodiments of the present invention, the BJT of FIG. 2B may be an NPN BJT with the first conductivity type being n-type conductivity, and with the second conductivity type being p-type conductivity. Mesa 203' may thus be an n-type emitter with region 203a' being a highly doped n-type region (N+) and with region 203b' being a very highly doped n-type region (N++), and substrate 219' may provide a highly doped n-type (N+) collector. Drift layer 217' may have n-type conductivity (N), base layer 215' may have p-type conductivity (P), buffer layer 209' may have n-type conductivity (N), current shifting region 211' may have a highly doped p-type conductivity (P+), and base contact region 207' may have a highly doped p-type conductivity (P+). While not shown in FIG. 2B, a very highly doped n-type layer (N++) may be provided on substrate 219' adjacent electrode 221' to provide ohmic contact with electrode 221'.

According to other embodiments of the present invention, the BJT of FIG. 2B may be a PNP BJT with the first conductivity type being p-type conductivity, and with the second conductivity type being n-type conductivity. Mesa 203' may thus be an p-type emitter with region 203a' being a highly doped p-type region (P+) and with region 203b' being a very highly doped p-type region (P++), and substrate 219' may provide a highly doped p-type (P+) collector. Drift layer 217' may have p-type conductivity (P), base layer 215' may have n-type conductivity (N), buffer layer 209' may have p-type conductivity (P), current shifting region 211' may have a highly doped n-type conductivity (N+), and base contact region may have a highly doped n-type conductivity (N+). While not shown in FIG. 2B, a very highly doped p-type layer (P++) may be provided on substrate 219' adjacent electrode 221' to provide ohmic contact with electrode 221'.

Figure 2C:
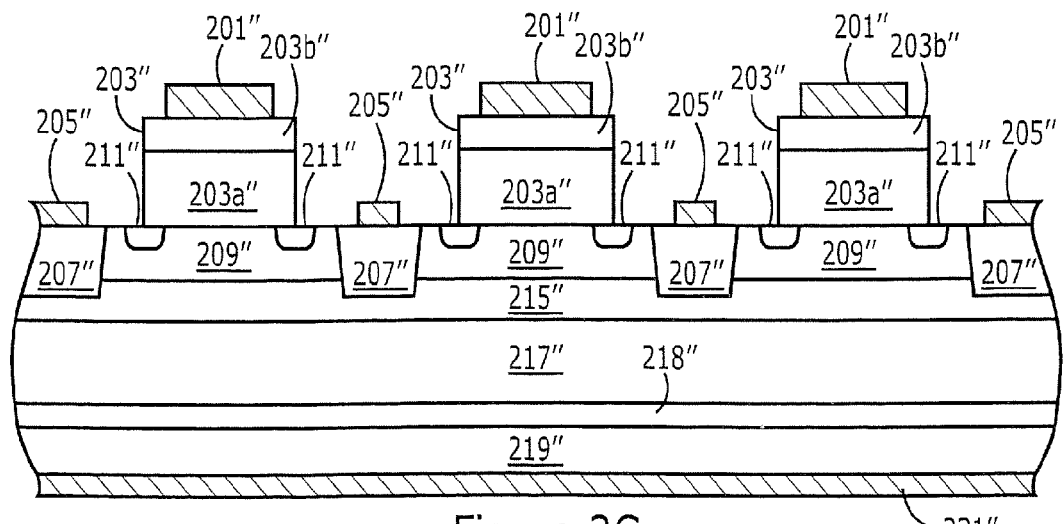
FIG. 2C is an alternative cross sectional view taken along section line i-i' of FIG. 2A illustrating a structure of a gate turn off thyristor (GTO) according to some embodiments of the present invention.

FIG. 2C is an alternative cross sectional view taken along section line i-i' of FIG. 2A illustrating a structure of a gate turn off thyristor (GTO) according to some embodiments of the present invention. In the GTO, first metal electrode 201" may be referred to as an anode/cathode electrode, second metal electrode 205" may be referred to as a gate electrode, and control contact region 207" may be referred to as a gate contact region. In addition to the elements discussed above with respect to FIG. 2A, the GTO of FIG. 2C may include a semiconductor gate layer 215" having the second conductivity type, semiconductor drift layers 217" and 218" having the first conductivity type, and semiconductor substrate 219" having the second conductivity type. The substrate 219" may serve as an anode/cathode, and a third metal electrode 221" may be referred to as an anode/cathode electrode. Accordingly, a current applied to electrode 205" (or gate electrode) may be used to control an electrical current between electrodes 201" and 221" (or between anode and cathode electrodes).

In addition, semiconductor mesa 203" may include regions 203a" and 203b" (both having the first conductivity type) with region 203b" having a higher concentration of majority carriers than region 203a". Region 203b", for example, may have a high dopant concentration to provide ohmic contact with electrode 201".

Accordingly, the GTO of FIG. 2C may provide switching/control of relatively high electrical currents between electrodes 201" and 221" responsive to an electrical signal applied to electrode 205". The GTO of FIG. 2C may thus be referred to as a "vertical" power device because the switched/controlled current flows in a "vertical" direction between electrodes 201" and 221" on opposite sides of substrate 219" (with "vertical" being determined with respect to the orientation of the structure as illustrated in FIG. 2C). Because the "vertical" current may be distributed across the continuous electrode 221" but concentrated at fingers of interdigitated electrode 201", current crowding may occur at corners between semiconductor mesas 203" and buffer layer 209". By providing current shifting region 211", this current crowding may be moved away from the corners between semiconductor mesas 203" and buffer layer 209". More particularly, a p-n junction defined between buffer layer 209" (having the first conductivity type) and current shifting region 211" (having the second conductivity type) and/or a p-n junction defined between the semiconductor mesa 203" (having the first conductivity type) and the current shifting region 211" (having the second conductivity type) may reduce/prohibit the flow of electrical current through the current shifting region 211".

Substrate 219" may be a silicon carbide substrate (SiC) having a surface that is cut off axis by an angle of no more than about 4 degrees or that is cut on axis to thereby reduce basal plane dislocations (BPDs). Substrate 219", for example, may be a 4H-polytype SiC substrate having a surface that corresponds generally to the c-face of the silicon carbide crystal that has been cut at an off axis angle α (alpha) towards the <11 $\overline{2}$0> (<one, one, two-bar, zero>) direction where the off axis angle α (alpha) is no more than about 4 degrees. SiC substrates with low off-cut angles are discussed, for example, in U.S. Provisional Application No. 61/118,825, filed Dec. 1, 2008, and entitled "Stable Power Devices On Low-Angle Off-Cut Silicon Carbide Crystals", the disclosure of which is hereby incorporated herein in its entirety by reference. Each of the semiconductor layers/regions on substrate 219" (e.g., drift layers 217" and 218", gate layer 215", buffer layer 209", mesa 203", gate contact region 207", and current shifting region 211") may be SiC layers/regions formed using epitaxial deposition, implant/diffusion, and/or etching. Accordingly, each of the semiconductor layers/regions (e.g., drift layer 217", gate layer 215", buffer layer 209", mesa 203", gate contact region 207", and current shifting region 211") on substrate 219" may have a single crystal structure that is aligned with a crystal structure of substrate 219".

According to some embodiments of the present invention, the GTO of FIG. 2C may be an n-type GTO with the first conductivity type being n-type conductivity, and with the second conductivity type being p-type conductivity. Mesa 203" may thus be an n-type cathode with region 203a" being a highly doped n-type region (N+) and with region 203b" being a very highly doped n-type region (N++), and substrate 219" may provide a highly doped p-type (P+) anode. Drift layer 217" may have a lightly doped n-type conductivity (N−), drift layer 218" may have n-type conductivity (N), gate layer 215" may have p-type conductivity (P), buffer layer 209" may have n-type conductivity (N), current shifting region 211" may have a highly doped p-type conductivity (P+), and gate contact region 207" may have a highly doped p-type conductivity (P+). While not shown in FIG. 2C, a very highly doped p-type layer (P++) may be provided on substrate 219" adjacent electrode 221" to provide ohmic contact with electrode 221".

According to other embodiments of the present invention, the GTO of FIG. 2C may be a p-type GTO with the first conductivity type being p-type conductivity, and with the second conductivity type being n-type conductivity. Mesa 203" may thus be a p-type anode with region 203a" being a highly doped p-type region (P+) and with region 203b" being a very highly doped p-type region (P++), and substrate 219" may provide a highly doped n-type (N+) cathode. Drift layer 217" may have lightly doped p-type conductivity (P−), drift layer 218" may have p-type conductivity (P), gate layer 215" may be n-type conductivity (N), buffer layer 209" may have p-type conductivity (P), current shifting region 211" may have a highly doped n-type conductivity (N+), and gate contact region 207" may have a highly doped n-type conductivity (N+). While not shown in FIG. 2C, a very highly doped n-type layer (N++) may be provided on substrate 219" adjacent electrode 221" to provide ohmic contact with electrode 221".

FIGS. 3A-3B, 4A-4B, and 5A-5B are enlarged cross sectional views illustrating operations of forming mesa and current shifting region structures according to embodiments of the present invention. In each of the cross sectional views, elements are discussed generically with respect to the BJT and GTO structures discussed above with respect to FIGS. 2B and 2C. Accordingly, operations and/or structures of FIGS. 3A-3B, 4A-4B, and 5A-5B may be applied to BJTs, GTOs, or any other semiconductor device including mesa structures according to embodiments of the present invention.

Figure 3A:
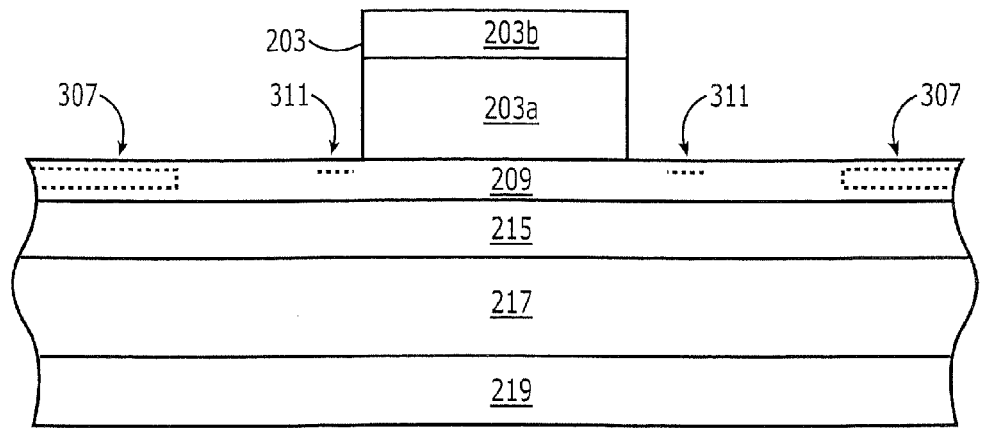
FIGS. 3A and 3B are enlarged cross sectionals views illustrating operations of forming mesa and current shifting region structures according to some embodiments of the present invention.

As shown in FIG. 3A, the structure may include semiconductor substrate 219 (e.g., substrate 219' of FIG. 2B, or substrate 219" of FIG. 2C), semiconductor drift layer 217 (e.g., drift layer 217' of FIG. 2B, or drift layers 217" and 218" of FIG. 2C), semiconductor control layer 215 (e.g., base layer 215' of FIG. 2B, or gate layer 215" of FIG. 2C), semiconductor buffer layer 209 (e.g., buffer layer 209' of FIG. 2B, or buffer layer 209" of FIG. 2C), and semiconductor mesa 203 (e.g., mesa 203' of FIG. 2B, or mesa 203" of FIG. 2C).

In particular, semiconductor drift layer 217, semiconductor control layer 215, and semiconductor buffer layer 209 may be formed by epitaxial deposition on semiconductor substrate 219. A mesa layer may be formed by epitaxial deposition on buffer layer 209 and then patterned (e.g., using reactive ion etching or RIE) to form semiconductor mesa 203. In-situ doping during material growth, in-situ diffusion after material growth, and/or subsequent implanting may be used to provide conductivity types and concentrations of majority carriers of the semiconductor layers of FIG. 3A. For example, in-situ doping during material growth may be used to provide conductivities/concentrations of drift layer 217, control layer 215, buffer layer 209, and mesa region 203a, and a subsequent implant may be used to increase a majority carrier concentration of mesa region 203b. While mesa 203 is shown ending exactly at buffer layer 209, some over etch may occur so that portions of buffer layer 209 may be included in mesa 203. Moreover, diffusion may blur a transition of carrier concentrations so that there is a gradual change in dopant concentration between buffer layer 209 and mesa region 203a. Stated in other words, a transition in carrier concentrations (of the same conductivity type) between buffer layer 209 and mesa region 203a may not coincide exactly with a base of mesa 203.

After forming semiconductor mesa 203, selective implants 307 and 311 (of the second conductivity type) may be performed to introduce dopants of the desired conductivity type for the control contact regions 207 and the current shifting regions 211 into buffer layer 209. A mask(s) may be used to cover regions of buffer layer 209 and mesa 203 for which implantation is not desired. Moreover, different profiles, energies, doses, and/or dopants may be used for implants 307 and 311 to provide different depths for the resulting control contact regions 207 and current shifting regions 211. For example, a dose and/or energy of implant 307 may be greater than a dose and/or energy of implant 311. Moreover, implant region 311 may be masked while performing an implant for region 307.

Figure 3B:
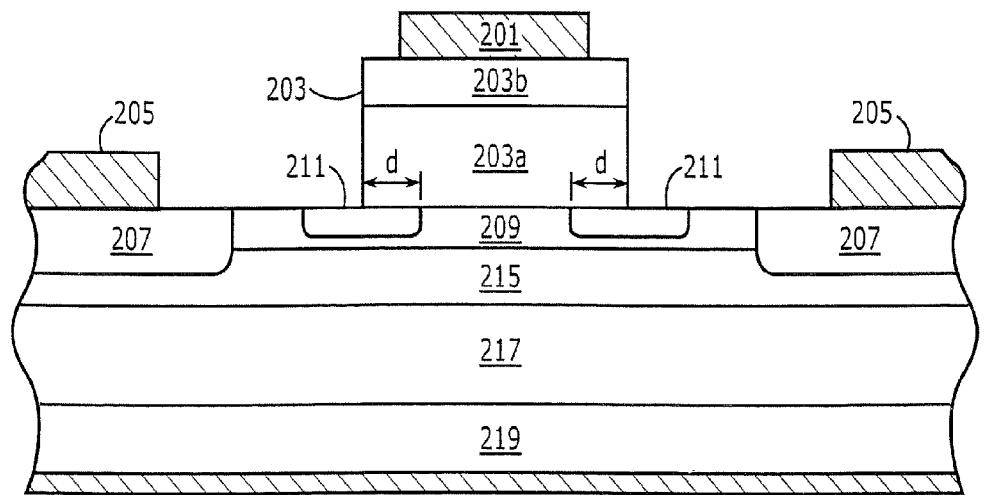

As shown in FIG. 3B, thermal activation/diffusion operations may be performed to activate and diffuse dopants from implants 307 and 311 to provide control contact regions 207 (e.g., base contact region 207' of FIG. 2B, or gate contact region 207" of FIG. 2C) and current shifting regions 211 (e.g., current shifting region 211' of FIG. 2B, or current shifting region 211" of FIG. 2C). While not shown in FIGS. 3A and 3B, some thermal activation/diffusion may occur before completing both implants. For example, some diffusion of implant region 307 may occur before competing all implanting for region 311. As a result of the diffusion(s), current shifting regions 211 may extend a distance d under peripheral regions of mesa 203 between mesa 203 and buffer layer 209. Distance d, for example, may be at least about 0.5 μm (micrometer), and more particularly, at least about 1 μm (micrometer). Distance d may be in the range of about 0.8 μm (micrometer) to about 1.2 μm (micrometer), and more particularly, distance d may be about 1 μm (micrometer). According to some embodiments of the present invention, distance d may be substantially 0 with a depth of current shifting regions 211 below the corner (between mesa 203 and buffer layer 209) providing sufficient reduction of current crowding at the corner.

A depth of current shifting regions 211 may be less than a thickness of buffer layer 209 so that portions of buffer layer 209 (of the first conductivity type) remain between current shifting regions 211 and control layer 215 (of the second conductivity type). Accordingly, current shifting regions 211 are electrically isolated from control contact regions 207 and control layer 215. A depth of control contact regions 207 may be greater than a thickness of buffer layer 209, so that control contact regions 207 provide electrical coupling through buffer layer 209 to control layer 215.

After forming control contact regions 207 and current shifting regions 211, metal electrodes 201, 205, and 221 (e.g. metal electrodes 201', 205', and 221' of FIG. 2B, or metal electrodes 201'', 205'', and 221'' of FIG. 2C) may be formed as shown in FIG. 3B. The metal electrodes may be formed after completing high temperature thermal activation/diffusion operations to avoid damage to the metal electrodes. Operations of FIGS. 3A and 3B may thus be used to provide structures of either of FIG. 2B or 2C, or other semiconductor devices including mesa structures.

Figure 4A:
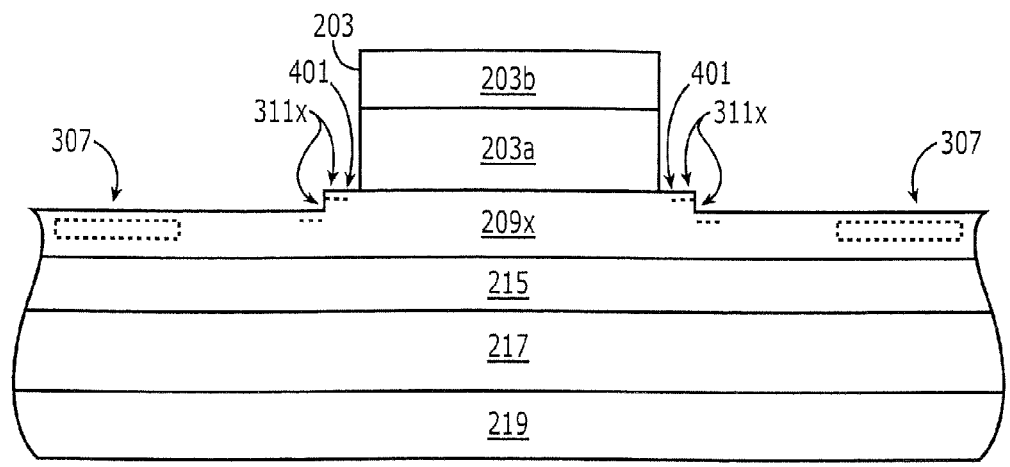
FIGS. 4A and 4B are enlarged cross sectional views illustrating operations of forming mesa, step, and current shifting region structures according to some embodiments of the present invention.

As shown in FIG. 4A, the structure may include semiconductor substrate 219 (e.g., substrate 219' of FIG. 2B, or substrate 219'' of FIG. 2C), semiconductor drift layer 217 (e.g., drift layer 217' of FIG. 2B, or drift layers 217'' and 218'' of FIG. 2C), semiconductor control layer 215 (e.g., base layer 215' of FIG. 2B, or gate layer 215'' of FIG. 2C), semiconductor buffer layer 209x (e.g., buffer layer 209' of FIG. 2B, or buffer layer 209'' of FIG. 2C), and semiconductor mesa 203 (e.g., mesa 203' of FIG. 2B, or mesa 203'' of FIG. 2C).

In particular, semiconductor drift layer 217 and semiconductor control layer 215 may be formed by epitaxial deposition on semiconductor substrate 219. Buffer and mesa layers may be formed by epitaxial deposition and then patterned using two mask/etch operations (e.g., using two reactive ion etching or RIE operations) to form semiconductor mesa 203 and a step 401 in buffer layer 209x. For example, a first mask and reactive ion etch operation may be used to etch mesa layers to form mesa 203, and then, a second mask and reactive ion etch operation may be used to etch the buffer layer to provide step 401 in buffer layer 209x adjacent mesa 203. While mesa 203 is shown ending exactly at buffer layer 209x, some over etch may occur so that portions of buffer layer 209x may be included in mesa 203. Moreover, diffusion may blur a transition of carrier concentrations so that there is a gradual change in dopant concentration between buffer layer 209x and mesa region 203a. Stated in other words, a transition in carrier concentrations (of the same conductivity type) between buffer layer 209x and mesa region 203a may not coincide exactly with a base of mesa 203. Formation of mesa steps and related structures are discussed in U.S. Publication No. 2009/0121319 entitled "Power Semiconductor Devices With Mesa Structures And Buffer Layers Including Mesa Steps," the disclosure of which is hereby incorporated herein in its entirety by reference.

In-situ doping during material growth, in-situ diffusion after material growth, and/or subsequent implanting may be used to provide conductivity types and concentrations of majority carriers of the semiconductor layers of FIG. 4A. For example, in-situ doping during material growth may be used to provide conductivities/concentrations of drift layer 217, control layer 215, buffer layer 209x, and mesa region 203a, and a subsequent implant may be used to increase a majority carrier concentration of mesa region 203b.

After forming semiconductor mesa 203, selective implants 307 and 311x (of the second conductivity type) may be performed to introduce dopants of the second conductivity type for the control contact regions 207 and the current shifting regions 211x into buffer layer 209x. More particularly, implant 311x may be provided on both sides of the step 401 in buffer layer 209x adjacent mesa 203. A mask(s) may be used to cover regions of buffer layer 209x and mesa 203 for which implantation is not desired. Moreover, different profiles, energies, doses, and/or dopants may be used for implants 307 and 311x to provide different depths for the resulting control contact regions 207 and current shifting regions 211x. For example, a dose and/or energy of implant 307 may be greater than a dose and/or energy of implant 311x. Moreover, implant region 311x may be masked while performing an implant for region 307.

Figure 4B:
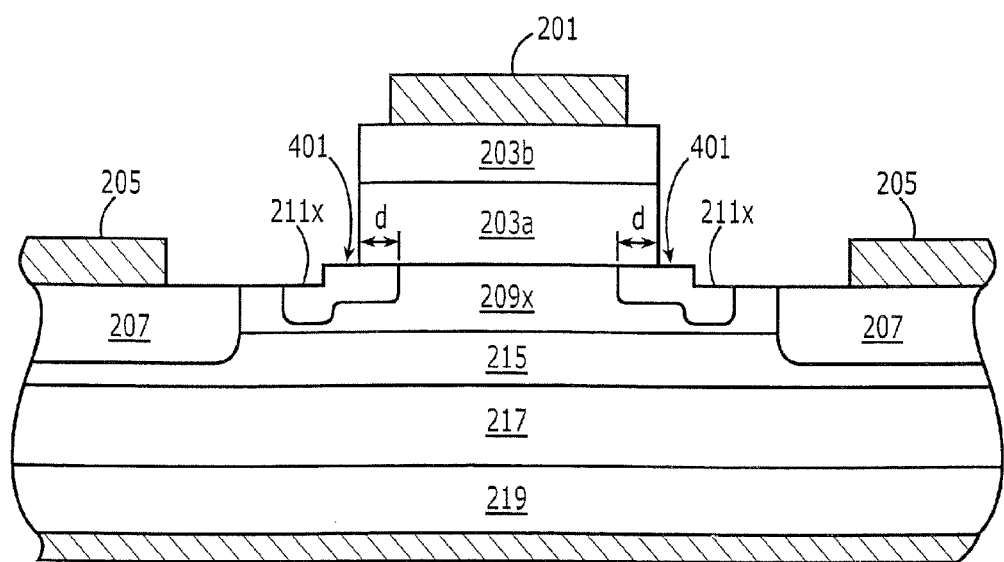

As shown in FIG. 4B, thermal activation/diffusion operations may be performed to activate and diffuse dopants from implants 307 and 311x to provide control contact regions 207 (e.g., base contact region 207' of FIG. 2B, or gate contact region 207'' of FIG. 2C) and current shifting regions 211x (e.g., current shifting region 211' of FIG. 2B, or current shifting region 211'' of FIG. 2C). While not shown in FIGS. 4A and 4B, some thermal activation/diffusion may occur before completing both implants. For example, some diffusion of implant region 307 may occur before competing all implanting for region 311x. As a result of the diffusion(s), current shifting regions 211x may extend a distance d under peripheral regions of mesa 203 between mesa 203 and buffer layer 209x. Distance d, for example, may be at least about 0.5 μm (micrometer), and more particularly, at least about 1 μm (micrometer). Distance d may be in the range of about 0.8 μm (micrometer) to about 1.2 μm (micrometer), and more particularly, distance d may be about 1 μm (micrometer). According to some embodiments of the present invention, distance d may be substantially 0 with a depth of current shifting regions 211x below the corner (between mesa 203 and buffer layer 209x) providing sufficient reduction of current crowding at the corner.

A depth of current shifting regions 211x may be less than a thickness of buffer layer 209x so that portions of buffer layer 209x (of the first conductivity type) remain between current shifting regions 211x and control layer 215 (of the second conductivity type). Accordingly, current shifting regions 211x are electrically isolated from control contact regions 207 and control layer 215. A depth of control contact regions 207 may be greater than a thickness of buffer layer 209x, so that control contact regions 207 provide electrical coupling through buffer layer 209x to control layer 215.

After forming control contact regions 207 and current shifting regions 211x, metal electrodes 201, 205, and 221 (e.g. metal electrodes 201', 205', and 221' of FIG. 2B, or metal electrodes 201'', 205'', and 221'' of FIG. 2C) may be formed as shown in FIG. 4B. The metal electrodes may be formed after completing high temperature thermal activation/diffusion operations to avoid damage to the metal electrodes. Operations of FIGS. 4A and 4B may thus be used to provide structures of either of FIG. 2B or 2C, or other semiconductor devices including mesa structures.

Figure 5A:
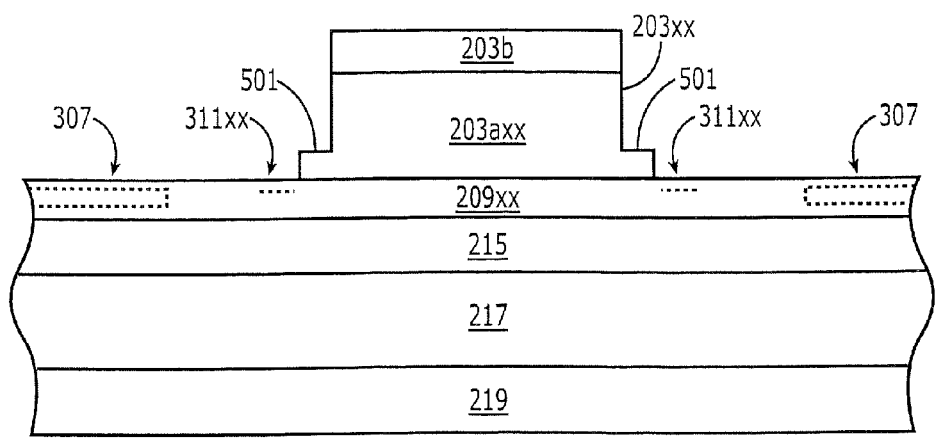
FIGS. 5A and 5B are enlarged cross sectional views illustrating operations of forming mesa, step, and current shifting region structures according to some embodiments of the present invention.

As shown in FIG. 5A, the structure may include semiconductor substrate 219 (e.g., substrate 219' of FIG. 2B, or substrate 219'' of FIG. 2C), semiconductor drift layer 217 (e.g., drift layer 217' of FIG. 2B, or drift layers 217" and 218" of FIG. 2C), semiconductor control layer 215 (e.g., base layer 215' of FIG. 2B, or gate layer 215" of FIG. 2C), semiconductor buffer layer 209xx (e.g., buffer layer 209' of FIG. 2B, or buffer layer 209" of FIG. 2C), and semiconductor mesa 203xx (e.g., mesa 203' of FIG. 2B, or mesa 203" of FIG. 2C).

In particular, semiconductor drift layer 217 and semiconductor control layer 215 may be formed by epitaxial deposition on semiconductor substrate 219. Buffer and mesa layers may be formed by epitaxial deposition and then patterned using two mask/etch operations (e.g., using two reactive ion etching or RIE operations) to form semiconductor mesa 203xx with a stepped base and buffer layer 209xx. For example, a first mask and reactive ion etch operation may be used to etch mesa layers to form portions of mesa 203xx down to an upper portion of mesa step 501. Stated in other words, the first etch may etch through most of the mesa layer without exposing buffer layer 209xx. Then, a second mask (wider than the first mask) and reactive ion etch operation may be used to etch exposed portions of mesa layer remaining on buffer layer 209xx to provide mesa step 501 at a base of mesa 203xx. While mesa 203xx (including step 501) is shown ending exactly at buffer layer 209xx, some over etch may occur so that portions of buffer layer 209xx may be included in mesa 203xx and/or step 501. Moreover, diffusion may blur a transition of carrier concentrations so that there is a gradual change in dopant concentration between buffer layer 209xx and mesa region 203axx. Stated in other words, a transition in carrier concentrations (of the same conductivity type) between buffer layer 209xx and mesa region 203axx may not coincide exactly with a base of mesa 203xx (including step 501). Formation of mesa steps and related structures are discussed in U.S. Publication No. 2009/0121319 entitled "Power Semiconductor Devices With Mesa Structures And Buffer Layers Including Mesa Steps," the disclosure of which is hereby incorporated herein in its entirety by reference.

In-situ doping during material growth, in-situ diffusion after material growth, and/or subsequent implanting may be used to provide conductivity types and concentrations of majority carriers of the semiconductor layers of FIG. 5A. For example, in-situ doping during material growth may be used to provide conductivities/concentrations of drift layer 217, control layer 215, buffer layer 209xx, and mesa region 203axx, and a subsequent implant may be used to increase a majority carrier concentration of mesa region 203b.

After forming semiconductor mesa 203xx, selective implants 307 and 311xx (of the second conductivity type) may be performed to introduce dopants of the second conductivity type for the control contact regions 207 and the current shifting regions 211xx into buffer layer 209xx. More particularly, implant 311xx may be provided adjacent mesa step 501. A mask(s) may be used to cover regions of buffer layer 209xx and mesa 203xx (including step 501) for which implantation is not desired. Moreover, different profiles, energies, doses, and/or dopants may be used for implants 307 and 311xx to provide different depths for the resulting control contact regions 207 and current shifting regions 211xx. For example, a dose and/or energy of implant 307 may be greater than a dose and/or energy of implant 311xx. Moreover, implant region 311xx may be masked while performing an implant for region 307.

Figure 5B:
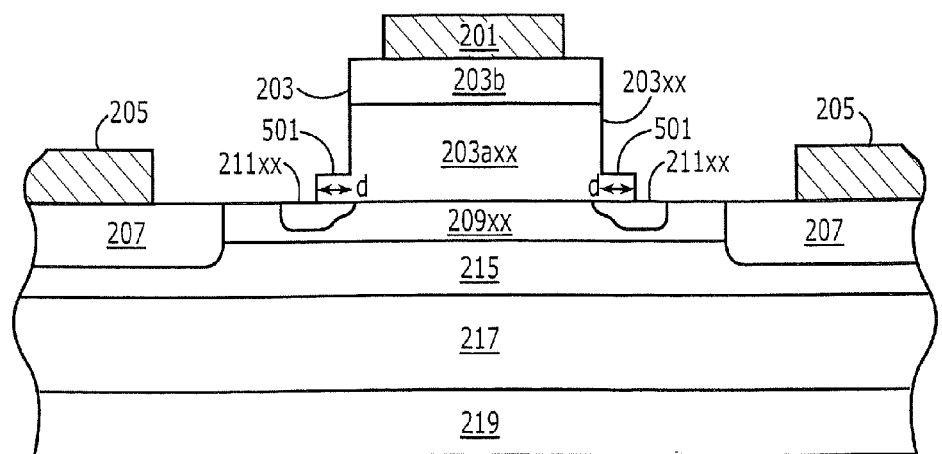

As shown in FIG. 5B, thermal activation/diffusion operations may be performed to activate and diffuse dopants from implants 307 and 311xx to provide control contact regions 207 (e.g., base contact region 207' of FIG. 2B, or gate contact region 207" of FIG. 2C) and current shifting regions 211xx (e.g., current shifting region 211' of FIG. 2B, or current shifting region 211" of FIG. 2C). While not shown in FIGS. 5A and 5B, some thermal activation/diffusion may occur before completing both implants. For example, a thermal diffusion/activation operation for implant region 307 may be performed before competing all implanting for region 311x. As a result of the diffusion(s), current shifting regions 211xx may extend a distance d under step 501 of mesa 203xx between mesa 203xx and buffer layer 209xx. Distance d, for example, may be at least about 0.5 µm (micrometer), and more particularly, at least about 1 µm (micrometer). Distance d may be in the range of about 0.8 µm (micrometer) to about 1.2 µm (micrometer), and more particularly, distance d may be about 1 µm (micrometer). According to some embodiments of the present invention, distance d may be substantially 0 with a depth of current shifting regions 211x below the corner (between mesa 203 and buffer layer 209x) providing sufficient reduction of current crowding at the corner. As shown in FIG. 5B, the distance d may be approximately the same as a width of step 501.

A depth of current shifting regions 211xx may be less than a thickness of buffer layer 209xx so that portions of buffer layer 209xx (of the first conductivity type) remain between current shifting regions 211xx and control layer 215 (of the second conductivity type). Accordingly, current shifting regions 211xx are electrically isolated from control contact regions 207 and control layer 215. A depth of control contact regions 207 may be greater than a thickness of buffer layer 209xx, so that control contact regions 207 provide electrical coupling through buffer layer 209xx to control layer 215.

After forming control contact regions 207 and current shifting regions 211xx, metal electrodes 201, 205, and 221 (e.g. metal electrodes 201', 205', and 221' of FIG. 2B, or metal electrodes 201", 205", and 221" of FIG. 2C) may be formed as shown in FIG. 5B. The metal electrodes may be formed after completing high temperature thermal activation/diffusion operations to avoid damage to the metal electrodes. Operations of FIGS. 5A and 5B may thus be used to provide structures of either of FIG. 2B or 2C, or other semiconductor devices including mesa structures.

FIG. 6A is an illustration of simulated current concentrations in a conventional BJT structure. In FIG. 6A, N+ SiC mesa emitter 503, N SiC buffer layer 509, P SiC base layer 515, P+ SiC base contact region 507, N SiC drift layer 517, and N+ SiC substrate layer 519 define a conventional NPN SiC bipolar junction transistor. In addition, metal emitter electrode 501, metal base electrode 505, and metal collector electrode 521 may provide electrical contact therewith. For purposes of the simulation, buffer layer 509 is shown in two sections, but both sections of buffer layer 509 were simulated as having the same N conductivity and carrier concentration. Moreover, various layers/regions (e.g., P SiC base layer 515, P+ SiC base contact region 507, N SiC drift layer 517, N+ SiC substrate layer 519, and metal collector electrode 521) are not illustrated/defined separately for ease of illustration and because separate illustration/definition would not significantly effect the simulation.

As shown in the simulation of FIG. 6A, a region of greatest current concentration may occur at the corner 531 defined by mesa 503 and buffer layer 509. Moreover, current crowding at this corner may increase defect generation due to carrier recombination and/or surface recombination, and this defect generation may cause performance degradation.

FIG. 6B is an illustration of simulated current concentrations in a BJT including a mesa step and a current shifting region according to some embodiments of the present invention discussed above with respect to FIGS. 2B and 5B. In FIG. 6B, N+ SiC mesa emitter 203xx (including step 501), N SiC buffer layer 209xx, P+ SiC current shifting region 211xx, P SiC base layer 215, P+ SiC base contact region 207, N SiC drift layer 217, and N+ SiC substrate layer 219 define an NPN SiC bipolar junction transistor according to some embodiments of the present invention. In addition, metal emitter electrode 201, metal base electrode 205, and metal collector electrode 221 may provide electrical contact therewith. While a gap is shown between current shifting region 211xx and electrode 205, portions of buffer layer 209xx and base contact region 207 may occupy this gap without changing the results of the simulation. Moreover, various layers/regions (e.g., P SiC base layer 215, P+ SiC base contact region 207, N SiC drift layer 217, N+ SiC substrate layer 219, and metal collector electrode 221) are not illustrated/defined separately for ease of illustration and because separate illustration/definition would not significantly effect the simulation.

As shown in the simulation of FIG. 6B, a region of greatest current concentration may occur in buffer layer 209xx between current shifting region 211xx and base layer 215. Stated in other words, current shifting region 211xx may separate the region of greatest current concentration from the corner defined at the base of mesa 203xx. By reducing current crowding at the corner, defect generation due to carrier recombination and/or surface recombination may be reduced. Accordingly, performance degradation may be reduced by including current shifting regions and/or steps according to some embodiments of the present invention.

Embodiments of the invention have been discussed above with respect to bipolar junction transistors (BJTs) and gate turn off thyristors (GTOs). The invention may be embodied, however, in other semiconductor devices including mesa structures.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor device comprising:
a semiconductor buffer layer having a first conductivity type and a buffer layer surface;
a semiconductor mesa having the first conductivity type on the buffer layer surface of the semiconductor buffer layer, wherein portions of the buffer layer surface are free of the semiconductor mesa, and wherein the semiconductor mesa includes a mesa surface spaced apart from the buffer layer surface and a mesa sidewall extending between the mesa surface and the buffer layer surface to define a mesa corner between the mesa sidewall and the buffer layer surface;
a semiconductor current shifting region having a second conductivity type adjacent a base of the semiconductor mesa, wherein the first and second conductivity types are different conductivity types; and
a metal electrode on the mesa surface, wherein the semiconductor mesa is between the metal electrode and the semiconductor buffer layer, and wherein central portions of the semiconductor mesa adjacent the semiconductor buffer layer are free of the semiconductor current shifting region to provide a continuous electrical current path of the first conductivity type from the metal electrode to a surface of the semiconductor buffer layer opposite the semiconductor mesa and/or to provide a continuous electrical current path of the first conductivity type from the surface of the semiconductor buffer layer opposite the semiconductor mesa to the metal electrode.

2. A semiconductor device according to claim 1 wherein the current shifting region is directly between the mesa corner and portions of the semiconductor buffer layer so that the semiconductor current shifting region is configured to shift current away from the mesa corner between the semiconductor mesa and the semiconductor buffer layer.

3. A semiconductor device according to claim 1 wherein the semiconductor current shifting region extends to portions of the semiconductor buffer layer that are free of the semiconductor mesa.

4. A semiconductor device according to claim 1 further comprising:
a semiconductor step adjacent the semiconductor mesa wherein a thickness of the semiconductor step in a direction perpendicular with respect to a surface of the semiconductor buffer layer is less than a thickness of the semiconductor mesa in the direction perpendicular with respect to the surface of the semiconductor buffer layer.

5. A semiconductor device according to claim 1 wherein the semiconductor current shifting region extends between portions of the semiconductor buffer layer and the semiconductor mesa so that portions of the semiconductor current shifting region are sandwiched between portions of the semiconductor buffer layer and the semiconductor mesa.

6. A semiconductor device according to claim 1 wherein the semiconductor current shifting region extends between the semiconductor buffer layer and the semiconductor mesa at the mesa corner.

7. A semiconductor device comprising:
a semiconductor buffer layer having a first conductivity type;
a semiconductor mesa having the first conductivity type on the semiconductor buffer layer;
a current shifting region having a second conductivity type adjacent a base of the semiconductor mesa, wherein the first and second conductivity types are different conductivity types;
a semiconductor control layer having the second conductivity type wherein the semiconductor buffer layer is on the semiconductor control layer so that the semiconductor buffer layer is between the semiconductor control layer and the semiconductor mesa and so that semiconductor buffer layer is between the current shifting region and the semiconductor control layer; and
a control contact region having the second conductivity type, wherein the control contact region extends through the semiconductor buffer layer to provide electrical coupling with the semiconductor control layer, wherein the control contact region is spaced apart from the current shifting region so that the current shifting region is electrically isolated from the control contact region.

8. A semiconductor device according to claim 7 further comprising:
a semiconductor drift layer having the first conductivity type on the semiconductor control layer so that the semiconductor control layer is between the semiconductor drift layer and the semiconductor buffer layer;
a first metal electrode on the semiconductor mesa so that the semiconductor mesa is between the first metal electrode and the semiconductor buffer layer;
a second metal electrode on the control contact region so that the control contact region is between the second metal electrode and the semiconductor control layer; and a third metal electrode on the semiconductor drift layer so that the semiconductor drift layer is between the third metal electrode and the semiconductor control layer.

9. A semiconductor device according to claim 8 further comprising:
a semiconductor anode/cathode layer having the second conductivity type between the semiconductor drift layer and the third metal electrode.

10. A semiconductor device according to claim 7 further comprising:
a silicon carbide substrate on the semiconductor control layer so that the semiconductor control layer is between the silicon carbide substrate and the semiconductor buffer layer, wherein the silicon carbide substrate defines a surface that is cut off axis at an angle of no more than about 4 degrees or that is cut on axis, and wherein crystalline structures of the semiconductor control layer, the semiconductor buffer layer, and the semiconductor mesa are aligned with respect to a crystalline structure of the silicon carbide substrate.

11. A semiconductor device according to claim 7 wherein the current shifting region extends between the semiconductor buffer layer and the semiconductor mesa by a distance of at least about 0.5 micrometers, wherein the semiconductor mesa includes an ohmic contact region having a first dopant concentration of the first conductivity type and a base region having a second dopant concentration of the first conductivity type, wherein the first dopant concentration is greater than the second dopant concentration, and wherein the ohmic contact region is separated from the current shifting region.

12. A semiconductor device according to claim 7 wherein the semiconductor mesa includes an ohmic contact region having a first dopant concentration of the first conductivity type and a base region having a second dopant concentration of the first conductivity type, and wherein the first dopant concentration is greater than the second dopant concentration, the semiconductor device further comprising:
a semiconductor step adjacent the semiconductor mesa wherein a thickness of the semiconductor step in a direction perpendicular with respect to a surface of the buffer layer is less than a thickness of the semiconductor mesa in the direction perpendicular with respect to the surface of the buffer layer, wherein the ohmic contact region is separated from the current shifting region.

13. A semiconductor device according to claim 7 wherein the current shifting region comprises a semiconductor current shifting region.

14. A semiconductor device according to claim 7 wherein the semiconductor current shifting region extends between the semiconductor mesa and the semiconductor buffer layer at the mesa corner.

15. A semiconductor device according to claim 7 further comprising:
a metal electrode on the mesa surface, wherein the semiconductor mesa is between the metal electrode and the semiconductor buffer layer, and wherein central portions of the semiconductor mesa adjacent the semiconductor buffer layer are free of the semiconductor current shifting region to provide a continuous electrical current path of the first conductivity type between the metal electrode and the semiconductor buffer layer opposite the semiconductor mesa.

16. A semiconductor device comprising:
a semiconductor buffer layer having a first conductivity type and a buffer layer surface;
a semiconductor mesa having the first conductivity type on the semiconductor buffer layer, wherein portions of the buffer layer surface are free of the semiconductor mesa, and wherein the semiconductor mesa includes a mesa surface spaced apart from the buffer layer surface and a mesa sidewall extending between the mesa surface and the buffer layer surface to define a mesa corner between the mesa sidewall and the buffer layer surface; and
a semiconductor current shifting region having a second conductivity type adjacent a base of the semiconductor mesa, wherein the first and second conductivity types are different conductivity types, and wherein the semiconductor current shifting region extends between portions of the semiconductor buffer layer and the semiconductor mesa;
wherein the semiconductor mesa includes an ohmic contact region having a first dopant concentration of the first conductivity type and a base region having a second dopant concentration of the first conductivity type, and wherein the first dopant concentration is greater than the second dopant concentration.

17. A semiconductor device according to claim 16 further comprising:
a semiconductor step adjacent the semiconductor mesa wherein a thickness of the semiconductor step in a direction perpendicular with respect to a surface of the semiconductor buffer layer is less than a thickness of the semiconductor mesa in the direction perpendicular with respect to the surface of the semiconductor buffer layer.

18. A semiconductor device according to claim 16 wherein the semiconductor current shifting region extends between the semiconductor buffer layer and the semiconductor mesa by a distance of at least about 0.5 micrometers.

19. A semiconductor device according to claim 16 wherein the ohmic contact region is separated from the semiconductor current shifting region.

20. A semiconductor device according to claim 16 wherein portions of the semiconductor current shifting region are sandwiched directly between portions of the semiconductor buffer layer and the semiconductor mesa.

21. A semiconductor device according to claim 16 wherein the semiconductor current shifting region extends between portions of the semiconductor buffer layer and the semiconductor mesa at the mesa corner.

22. A semiconductor device comprising:
a semiconductor buffer layer having a first conductivity type and a buffer layer surface;
a semiconductor mesa having the first conductivity type on the semiconductor buffer layer, wherein portions of the buffer layer surface are free of the semiconductor mesa, and wherein the semiconductor mesa includes a mesa surface spaced apart from the buffer layer surface and a mesa sidewall extending between the mesa surface and the buffer layer surface to define a mesa corner between the mesa sidewall and the buffer layer surface;
a semiconductor current shifting region having a second conductivity type adjacent a base of the semiconductor mesa, wherein the first and second conductivity types are different conductivity types, and wherein the semiconductor current shifting region extends between portions of the semiconductor buffer layer and the semiconductor mesa; and
a metal electrode on a surface of the semiconductor mesa, wherein the semiconductor mesa is between the metal electrode and the semiconductor buffer layer, and wherein central portions of the semiconductor mesa adjacent the semiconductor buffer layer are free of the semiconductor current shifting region to provide a continuous electrical current path of the first conductivity type from the metal electrode to a surface of the semiconductor buffer layer opposite the semiconductor mesa and/or provide a continuous electrical current path of the first conductivity type from the surface of the semiconductor buffer layer opposite the semiconductor mesa to the metal electrode.

23. A semiconductor device according to claim 22 wherein the semiconductor mesa includes an ohmic contact region having a first dopant concentration of the first conductivity type and a base region having a second dopant concentration of the first conductivity type, and wherein the first dopant concentration is greater than the second dopant concentration.

24. A semiconductor device according to claim 22 wherein portions of the semiconductor current shifting region are sandwiched directly between portions of the semiconductor buffer layer and the semiconductor mesa.

25. A semiconductor device according to claim 22 wherein the semiconductor current shifting region extends between portions of the semiconductor buffer layer and the semiconductor mesa at the mesa corner.

26. A semiconductor device comprising:
  a semiconductor buffer layer having a first conductivity type;
  a semiconductor mesa having the first conductivity type on the semiconductor buffer layer;
  a current shifting region having a second conductivity type adjacent a base of the semiconductor mesa, wherein the first and second conductivity types are different conductivity types;
  a semiconductor control layer having the second conductivity type wherein the semiconductor buffer layer is on the semiconductor control layer so that the semiconductor buffer layer is between the semiconductor control layer and the semiconductor mesa and so that semiconductor buffer layer is between the current shifting region and the semiconductor control layer; and
  a control contact region having the second conductivity type, wherein the control contact region extends through the semiconductor buffer layer to provide electrical coupling with the semiconductor control layer, wherein the control contact region is spaced apart from the current shifting region so that portions of the semiconductor buffer layer are between the current shifting region and the control contact region.

27. A semiconductor device according to claim 26 further comprising:
  a semiconductor drift layer having the first conductivity type on the semiconductor control layer so that the semiconductor control layer is between the semiconductor drift layer and the semiconductor buffer layer;
  a first metal electrode on the semiconductor mesa so that the semiconductor mesa is between the first metal electrode and the semiconductor buffer layer;
  a second metal electrode on the control contact region so that the control contact region is between the second metal electrode and the semiconductor control layer; and
  a third metal electrode on the semiconductor drift layer so that the semiconductor drift layer is between the third metal electrode and the semiconductor control layer.

28. A semiconductor device according to claim 27 further comprising:
  a semiconductor anode/cathode layer having the second conductivity type between the semiconductor drift layer and the third metal electrode.

29. A semiconductor device according to claim 26 further comprising:
  a silicon carbide substrate on the semiconductor control layer so that the semiconductor control layer is between the silicon carbide substrate and the semiconductor buffer layer, wherein the silicon carbide substrate defines a surface that is cut off axis at an angle of no more than about 4 degrees or that is cut on axis, and wherein crystalline structures of the semiconductor control layer, the semiconductor buffer layer, and the semiconductor mesa are aligned with respect to a crystalline structure of the silicon carbide substrate.

30. A semiconductor device according to claim 26 wherein the current shifting region extends between the semiconductor buffer layer and the semiconductor mesa by a distance of at least about 0.5 micrometers, wherein the semiconductor mesa includes an ohmic contact region having a first dopant concentration of the first conductivity type and a base region having a second dopant concentration of the first conductivity type, wherein the first dopant concentration is greater than the second dopant concentration, and wherein the ohmic contact region is separated from the current shifting region.

31. A semiconductor device according to claim 26 wherein the semiconductor mesa includes an ohmic contact region having a first dopant concentration of the first conductivity type and a base region having a second dopant concentration of the first conductivity type, and wherein the first dopant concentration is greater than the second dopant concentration, the semiconductor device further comprising:
  a semiconductor step adjacent the semiconductor mesa wherein a thickness of the semiconductor step in a direction perpendicular with respect to a surface of the buffer layer is less than a thickness of the semiconductor mesa in the direction perpendicular with respect to the surface of the buffer layer, wherein the ohmic contact region is separated from the current shifting region.

32. A semiconductor device according to claim 26 wherein the current shifting region comprises a semiconductor current shifting region.

33. A semiconductor device according to claim 26 wherein the semiconductor current shifting region extends between the semiconductor mesa and the semiconductor buffer layer at the mesa corner.

34. A semiconductor device according to claim 26 further comprising:
  a metal electrode on the mesa surface, wherein the semiconductor mesa is between the metal electrode and the semiconductor buffer layer, and wherein central portions of the semiconductor mesa adjacent the semiconductor buffer layer are free of the semiconductor current shifting region to provide a continuous electrical current path of the first conductivity type between the metal electrode and the semiconductor buffer layer opposite the semiconductor mesa.

* * * * *